United States Patent [19]

Grugett

[11] Patent Number: 5,767,733
[45] Date of Patent: Jun. 16, 1998

[54] BIASING CIRCUIT FOR REDUCING BODY EFFECT IN A BI-DIRECTIONAL FIELD EFFECT TRANSISTOR

[75] Inventor: Bruce C. Grugett, Cumming, Ga.

[73] Assignee: Integrated Device Technology, Inc., Santa Clara, Calif.

[21] Appl. No.: 710,603

[22] Filed: Sep. 20, 1996

[51] Int. Cl.$^6$ .............................................. H03K 17/795
[52] U.S. Cl. ........................ 327/534; 327/536; 327/436; 327/437
[58] Field of Search ........................... 327/534–537, 327/434, 436, 437

[56] References Cited

U.S. PATENT DOCUMENTS

| | | | |
|---|---|---|---|
| 3,806,741 | 4/1974 | Smith | 307/304 |
| 4,473,758 | 9/1984 | Huntington | 307/296 R |
| 4,473,761 | 9/1984 | Peterson | 307/579 |
| 4,529,897 | 7/1985 | Suzuki et al. | 307/571 |
| 4,709,172 | 11/1987 | Williams | 307/585 |
| 4,733,108 | 3/1988 | Truong | 307/296 R |
| 4,871,928 | 10/1989 | Bushey | 307/446 |
| 5,109,187 | 4/1992 | Guliani | 323/313 |
| 5,157,280 | 10/1992 | Schreck et al. | 307/196.5 |
| 5,191,244 | 3/1993 | Runaldue et al. | 307/475 |
| 5,206,544 | 4/1993 | Chen et al. | 307/443 |
| 5,332,916 | 7/1994 | Hirai | 257/369 |
| 5,420,055 | 5/1995 | Vu et al. | 437/40 |
| 5,422,583 | 6/1995 | Blake et al. | 327/94 |
| 5,422,591 | 6/1995 | Rastegar et al. | 327/409 |
| 5,430,403 | 7/1995 | Moyer et al. | 327/365 |

OTHER PUBLICATIONS

Sedra, et al., *Microelectronic Circuits*, CBS College Publishing, New York, NY, 1982, Section 8.2, pp. 310–312.

*The New IEEE Standard Dictionary of Electrical and Electronic Terms*, Fifth Edition, The Institute of Electrical and Electronics Engineers, Inc., New York, NY, 1993, p. 120.

*Primary Examiner*—Timothy P. Callahan
*Assistant Examiner*—An T. Luu
*Attorney, Agent, or Firm*—Skjerven, Morrill, MacPherson, Franklin, and Friel

[57] ABSTRACT

A field effect transistor (FET) includes a first source/drain terminal, a body terminal, and a second source/drain terminal. A bi-directional N-channel FET circuit includes a biasing circuit which couples the body terminal of the bi-directional FET to one of its first and second source/drain terminals having a lesser voltage when the first and second source/drain voltages differ by more than a threshold voltage. When the voltages differ by a threshold voltage or less, the body terminal floats at a voltage no higher than a diode drop above the lesser of the two source/drain voltages, and at a voltage no lower than a threshold voltage below the higher of the two source/drain voltages. An analogous bi-directional P-channel FET circuit is also described. Body effect is reduced because the body terminal of the FET is maintained at a voltage at or near the voltage of the effective source terminal at all times, irrespective of which of the two source/drain terminals is the effective source terminal. Consequently, the ON-resistance of the FET is reduced.

19 Claims, 2 Drawing Sheets

BIASING CIRCUIT FOR REDUCING BODY EFFECT IN A BI-DIRECTIONAL FIELD EFFECT TRANSISTOR

BACKGROUND OF THE INVENTION

1. Field of the Invention

The present invention relates to the design of integrated transistor circuits, and particularly to those integrated circuits having transistors with bi-directional current flow.

2. Description of Related Art

A semiconductor transistor may be conceptualized as having a control terminal which controls the flow of current between a first current-handling terminal and a second current-handling terminal. An appropriate condition on the control terminal causes a current to flow from/to the first current-handling terminal and to/from the second current-handling terminal. In a bipolar NPN transistor, the first current-handling terminal is the collector terminal, the control terminal is the base terminal, and the second current-handling terminal is the emitter terminal. A sufficient base current into the base terminal causes a collector-to-emitter current to flow. In a bipolar PNP transistor, the first current-handling terminal is the emitter terminal, the control terminal is the base terminal, and the second current-handling terminal is the collector terminal. A sufficient base current exiting the base terminal causes an emitter-to-collector current to flow.

A field effect transistor (FET) may likewise be conceptualized as having a control terminal which controls the flow of current between a first current-handling terminal and a second current-handling terminal. Such transistors include those termed MOSFET transistors (Metal-Oxide-Semiconductor FET) even though the gate of such a transistor may not be a metal and the "oxide" may not be a strict silicon oxide, and which transistors may also be more generally termed an IGFET transistor (Insulated-Gate FET). Although FET transistors are frequently discussed as having a drain terminal, a gate terminal, and a source terminal, in most such devices the drain terminal is interchangeable with the source terminal. This is because the layout and semiconductor processing of the FET is symmetrical (which is typically not the case for bipolar transistors). For an N-channel FET, the current-handling terminal normally residing at the higher voltage is customarily called the drain terminal. The current-handling terminal normally residing at the lower voltage is customarily called the source terminal. A sufficient voltage on the gate terminal causes a current to therefore flow from the drain terminal to the source terminal. The source voltage referred to in N-channel FET device equations merely refers to whichever drain or source terminal has the lower voltage at the time. For example, the "source" of the N-channel device of a bi-directional CMOS transfer gate depends on which side of the transfer gate is at a lower voltage. To reflect this symmetry of most FETs, the first current-handling terminal may be termed the "drain/source terminal" and the second current-handling terminal may be termed the "source/drain terminal". Alternatively, the first current-handling terminal may be termed the "first source/drain terminal" and the second current-handling terminal may be termed the "second source/drain terminal". All too frequently, descriptions in the art refer to a "drain terminal" and a "source terminal" even though the FET so described is symmetrical and the terminals are in fact interchangeable. Those skilled in the art readily appreciate such symmetry and accept the nomenclature for its clarity and conciseness. Such a description is equally valid for a P-channel FET transistor, since the polarity between drain and source voltages, and the direction of current flow between drain and source, is not implied by such terminology.

The drain-to-source current through a FET is a function of its gate-to-source voltage minus its threshold voltage, its drain-to-source voltage, and other factors. This may be represented as $I_{DS}=f(V_{GS}-V_T, V_{DS})$. The threshold voltage of the FET depends upon the voltage difference between the "source" and the "body" of the transistor. This relationship is known as the "body effect" and is well known in the art. For example, see *The New IEEE Standard Dictionary of Electrical and Electronics Terms*, on page 120 (The Institute of Electrical and Electronics Engineers, Fifth Edition, 1993), and see Sedra and Smith, *Microelectronic Circuits*, at page 310–312 (CBS College Publishing; Holt, Rinehart and Winston, 1982). In an N-channel FET, the body effect acts to increase the threshold voltage as the voltage of the transistor source region increases relative to the voltage of the transistor body. Such an increase in the threshold voltage due to body effect is reflected in a higher ON-resistance of the FET (i.e., a lower conductivity) for a given set of terminal voltages when conducting. Conversely, in a P-channel FET, the body effect acts to increase the threshold voltage as the voltage of the transistor source decreases relative to the voltage of the transistor body. Early literature frequently uses the term "substrate" for the transistor body when discussing body effect for a circuit including only single conductivity-type transistors fabricated on a substrate of opposite conductivity type, but the body of a transistor in a CMOS process may be a well region (e.g., a P-well region) within which the transistor is fabricated, rather than the substrate itself. Nonetheless, the "body" of a transistor (in the context of body effect) refers to the underlying semiconductor region just below the channel region of the transistor. The body terminal connects to this semiconductor region and provides a circuit path for the transistor body to be driven to a particular body voltage.

In many circuit configurations, it is common to electrically connect the body terminal of N-channel transistors to the more negative power supply voltage (e.g., $V_{SS}$) and to electrically connect the body terminal of P-channel transistors to the more positive power supply voltage (e.g., $V_{DD}$). For example, FIG. 1 shows a schematic diagram of a conventional CMOS inverter 22. The traditional electrical connection of the respective body terminal of both FETs is also shown. An INPUT terminal 10 is connected to the respective gate terminals of both P-channel transistor 14 and N-channel transistor 16. The source terminal of transistor 14 is connected to a power supply terminal 13 for receiving a positive power supply voltage (e.g., 3.3 volts). The body terminal 18 of transistor 14 is also connected to the power supply terminal 13. The drain terminal of transistor 14 is connected to the OUTPUT terminal 12. The source terminal of transistor 16 is connected to reference supply terminal 10 for receiving a reference voltage (e.g., ground or $V_{SS}$). The body terminal 20 of transistor 16 is also connected to the reference supply terminal 10. The drain terminal of transistor 16 is connected to the OUTPUT terminal 12. Operation of the CMOS inverter 22 is notoriously well known in the art, and will not be discussed herein.

The same CMOS inverter 22 is frequently diagrammed as depicted in FIG. 2.

Because the body terminal connections (shown in FIG. 1) for both transistors 14 and 16 are so commonly used, they are frequently eliminated from the schematic drawing to reduce clutter on the schematic page. Nonetheless, one skilled in the art understands that, for FIG. 2, the body terminal connections are as depicted in FIG. 1 by implication unless specifically indicated to the contrary.

The transistor 14 and 16 discussed above each have a respective source terminal connected to a respective power supply terminal, and each conducts current in only one direction (i.e., through the transistor from drain-to-source). For example, transistor 16 is typically never biased with its drain voltage lower than its source voltage. By connecting the body terminal to the same potential as the source terminal, the voltage differential between the source and the body is constant, and body effect is zero and does not increase the ON-resistance of the transistor 16.

In contrast, FIG. 3 shows an N-channel transistor 36 which may conduct bi-directionally. Either a source terminal 30 (i.e., a first source/drain terminal) or a drain terminal 34 (i.e., a second source/drain terminal) may have a lower voltage at any given time, and the transistor 36 conducts from the source/drain terminal having a higher voltage to the source/drain terminal having a lower voltage, provided the voltage presented to gate terminal 32 is sufficiently high. The body terminal 38 may be hard-connected to the source/drain terminal which resides more frequently at a lower voltage. For example, the body terminal 38 of transistor 36 is connected to the source terminal 30. As long as the source terminal 30 resides at a lower voltage than the drain terminal 34 (i.e., the current flow is always uni-directional), transistor 36 has no body effect. Unfortunately, when drain terminal 34 resides at a lower voltage than source terminal 30 (i.e., when current flow is in the direction from source terminal 30 to drain terminal 34), the ON-resistance of transistor 36 is increased by the body effect. Consequently, circuit performance is compromised. Frequently it is desirable to implement a transistor having the lowest possible ON-resistance per unit area devoted to building the transistor. What is needed is a transistor having reduced body effect when operated in a bidirectional manner such as, for example, a transmission gate.

SUMMARY OF THE INVENTION

In one embodiment of the present invention, a method of biasing a bidirectional FET includes comparing a first source/drain voltage at the first source/drain terminal of the FET with a second source/drain voltage at the second source/drain terminal of the FET, and applying a body voltage to the body terminal in response to the comparing step. The applied body voltage may be equal to the lesser of the first and second source/drain voltages, particularly for an N-channel FET. The applied body voltage may also be equal to the greater of the first and second source/drain voltages, particularly for a P-channel FET. Such a body voltage may be applied whenever the first and second voltages differ by more than a particular amount, such as, for example, a threshold voltage or another suitable amount. Either or both of the first and second source/drain terminals may be non-power supply terminals, and the FET may form a transmission gate.

In another embodiment of the present invention, a method of biasing a bidirectional FET having a first source/drain terminal, a second source/drain terminal, and a body terminal includes electrically coupling the body terminal to one of said first and second source/drain terminals in response to a first source/drain voltage at the first source/drain terminal and a second source/drain voltage at the second source/drain terminal. The FET may be a P-channel FET, in which case the body terminal is coupled to one of the first and second source/drain terminals having a greater voltage. The FET may also be an N-channel FET, in which case the body terminal is coupled to one of the first and second source/drain terminals having a lesser voltage. The body terminal may be coupled whenever the first and second source/drain voltages differ by more than a particular amount, such as, for example, a threshold voltage or another suitable amount.

In yet another embodiment of the present invention, a circuit with a biased FET includes a first FET having a first source/drain terminal, a second source/drain terminal, and a body terminal. A biasing circuit is included for biasing the body terminal of the first FET in response to a first source/drain voltage at the first source/drain terminal and a second source/drain voltage at the second source/drain terminal. The biasing circuit may include no circuit nodes other than those to which the first source/drain terminal of the first FET, the second source/drain terminal of the first FET, and the body terminal of the first FET are connected, or alternatively may include other circuit nodes. The biasing circuit may electrically couple the body terminal to one of the first and second source/drain terminals when the first and second source/drain voltages differ by more than a particular amount, such as, for example, a threshold voltage or other suitable amount. The first FET may be a P-channel FET, in which case the biasing circuit electrically couples the body terminal to one of the first and second source/drain terminals having a greater voltage. The first FET may be an N-channel FET, in which case the biasing circuit electrically couples the body terminal to one of the first and second source/drain terminals having a lesser voltage.

The biasing circuit may include a second FET having a first source/drain terminal coupled to the body terminal of the first FET, having a gate terminal coupled to the first source/drain terminal of the first FET, having a second source/drain terminal coupled to the second source/drain terminal of the first FET, and having a body terminal. The biasing circuit may further include a third FET having a first source/drain terminal coupled to the body terminal of the first FET, having a gate terminal coupled to the second source/drain terminal of the first FET, having a second source/drain terminal coupled to the first source/drain terminal of the first FET, and having a body terminal. The respective body terminals of the first, second, and third FETs may be interconnected to form a single circuit node. Moreover, the first, second, and third FETs may be disposed within a common well region of a first conductivity type and share a single body terminal. Each of the first, second, and third FETs may be an N-channel or a P-channel FET.

In another embodiment of the present invention, a circuit with a biased FET includes: (1) a first FET having a first source/drain terminal, a second source/drain terminal, and a body terminal; (2) first means for coupling the body terminal of the first FET to the first source/drain terminal of the first FET; and (3) second means for coupling the body terminal of the first FET to the second source/drain terminal of the first FET.

BRIEF DESCRIPTION OF THE DRAWINGS

The present invention may be better understood, and its numerous features and advantages made apparent to those skilled in the art by referencing the accompanying drawings, in which.

DETAILED DESCRIPTION OF THE PREFERRED EMBODIMENTS

Figure 1:
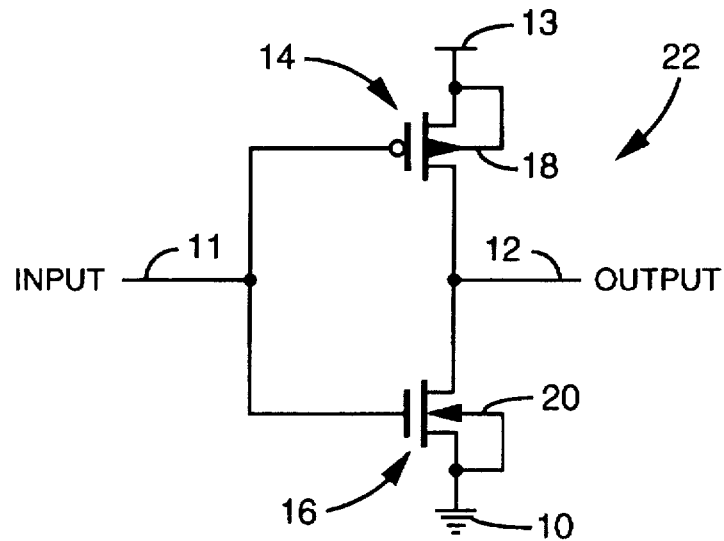
FIG. 1, labeled prior art, is a schematic circuit diagram of a conventional CMOS inverter, showing the traditional electrical connection of the respective body terminals of both FETs.
Figure 2:
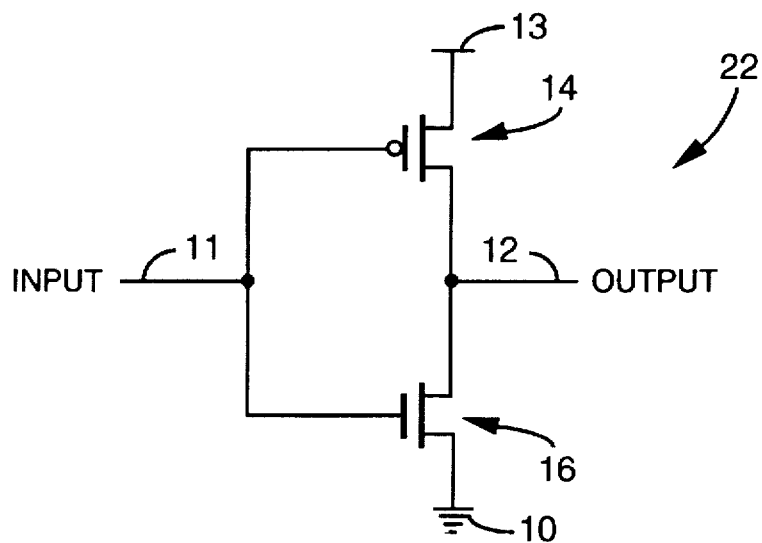
FIG. 2, labeled prior art, is a schematic circuit diagram of the conventional CMOS inverter of FIG. 1, but illustrated in a manner frequently encountered which omits showing the traditional electrical connection of the respective body terminals of both FETs.
Figure 3:
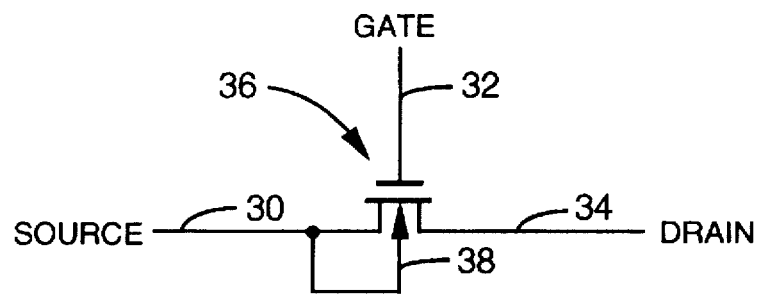
FIG. 3, labeled prior art, is a schematic circuit diagram of a conventional NMOS transmission gate, showing a conventional electrical connection of the body terminal of the FET.
Figure 4:
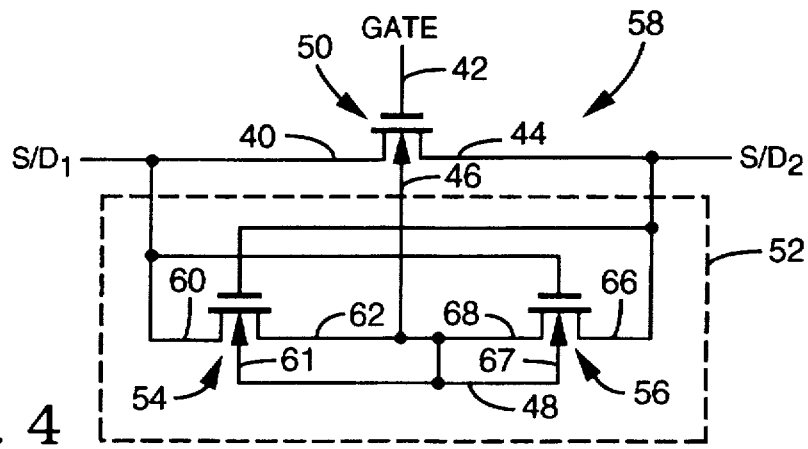
FIG. 4 is a schematic circuit diagram of a FET and a biasing circuit in accordance with the present invention.

Referring to FIG. 4, a biased FET circuit 58 includes an N-channel FET 50 having a first source/drain terminal 40 ("S/D$_1$ terminal 40"), a gate terminal 42, a second source/drain terminal 44 ("S/D$_2$ terminal 44"), and a body terminal 46 connected to a body node 48. A biasing circuit 52 includes an N-channel FET 54 having a first source/drain terminal 60 connected to the S/D$_1$ terminal 40, a gate terminal connected to the S/D$_2$ terminal 44, a second source/drain terminal 62 connected to the body node 48, and a body terminal 61 also connected to the body node 48. The biasing circuit 52 also includes an N-channel FET 56 having a first source/drain terminal 66 connected to the S/D$_2$ terminal 44, a gate terminal connected to the S/D$_1$ terminal 40, a second source/drain terminal 68 connected to the body node 48, and a body terminal 67 also connected to the body node 48.

When FET 50 is conducting current, a voltage drop exists between the "drain" terminal (the source/drain terminal having a higher voltage) and the "source" terminal. If no voltage drop exists across FET 50 (i.e., $V_{DS}=0$) then the FET 50 is not conducting (even though the gate voltage may be sufficient to form a channel between the drain and source regions), and the ON-resistance of the FET is of little consequence.

The operation of the bias circuit 52 may be most easily understood by first assuming that the voltage of the S/D$_2$ terminal 44 (the "S/D$_2$ voltage") exceeds the voltage of the S/D$_1$ terminal 40 (the "S/D$_1$ voltage") by several volts. If the threshold voltage of FET 54 is, for example, 0.6 volts, then the gate-to-source voltage of FET 54 (i.e., $V_{SD2}-V_{SD1}$) exceeds the threshold voltage of FET 54. Consequently, FET 54 is conductive and the body terminal 46 of FET 50 (body node 48) is electrically coupled to the S/D$_1$ terminal 40. This drives the body voltage of FET 50 to the voltage of the S/D$_1$ terminal 40, which (for this example) is the lesser in voltage of the two source/drain terminals of FET 50. If the threshold voltage of FET 56 is also, for example, 0.6 volts, then the gate-to-source voltage of FET 56 (i.e., $V_{SD1}-V_{SD2}$) is less than the threshold voltage of FET 56. Consequently, FET 56 is turned off. Of course, the body terminal may be driven if implemented within a well region of a conductivity type opposite that of the substrate (e.g., a P-well region formed on an N-type substrate).

On the other hand, assume the voltage of the S/D$_1$ terminal 40 exceeds the voltage of the S/D$_2$ terminal 44 by several volts. If the threshold voltage of FET 56 is, for example, 0.6 volts, then the gate-to-source voltage of FET 56 (i.e., $V_{SD1}-V_{SD2}$) exceeds the threshold voltage of FET 56. Consequently, FET 56 is conductive and the body terminal 46 of FET 50 (body node 48) is electrically coupled to the S/D$_2$ terminal 44. This drives the body voltage of FET 50 to the voltage of the S/D$_2$ terminal 44, which (for this assumption) is the lesser in voltage of the two source/drain terminals of FET 50.

If neither source/drain voltage of the FET 50 (S/D$_1$ voltage and S/D$_2$ voltage) exceeds the other source/drain voltage by at least a threshold voltage, then both FET 54 and FET 56 are turned off. If the body voltage (the voltage of body node 48) is within a range near the voltage of either S/D$_1$ terminal 40 or S/D$_2$ terminal 44, the body terminal of all three FETs (body node 48) is floating. If the body voltage is below such a floating range, the body voltage is clamped and pulled-up to a minimum voltage which is equal to a threshold voltage below the higher of the S/D$_1$ voltage and the S/D$_2$ voltage. Alternatively, if the body voltage is above the floating range, the body voltage is clamped and pulled-down by either: (1) at least one of the parasitic diodes between the N+source/drain regions (for this example) of each FET and the P-well region within which the FETs are implemented, to a voltage equal to a diode drop above the lesser of the S/D$_1$ voltage and the S/D$_2$ voltage; or (2) the parasitic diode between the P-well region (for this example) and an N-type substrate, to a voltage equal to a diode drop above the substrate voltage. Alternatively, such a P-well region may be implemented on a P-type wafer, and no diode therebetween exists. When the body voltage remains at any voltage within this narrow floating range, the small amount of body effect causes little degradation of the ON-resistance of the FET 50.

Figure 5:
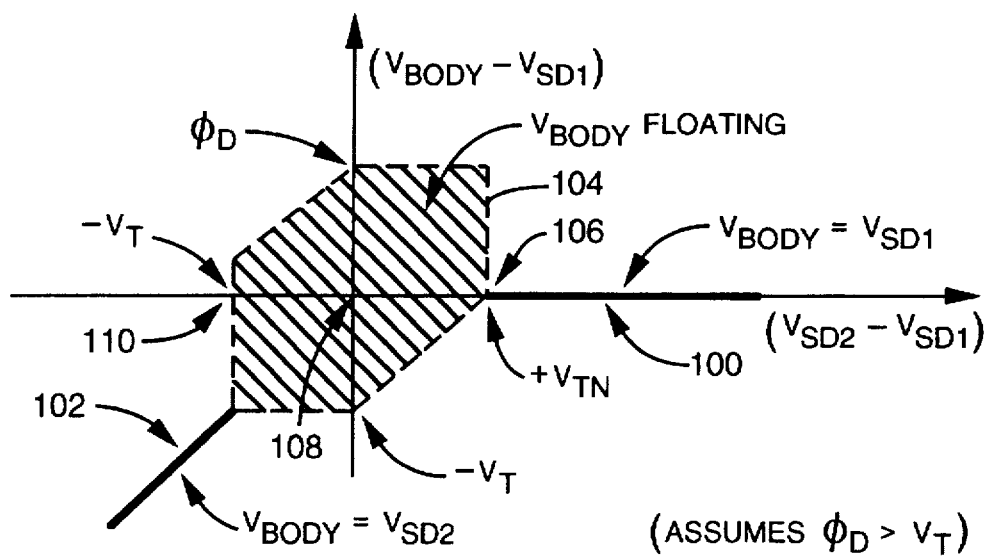
FIG. 5 is a two-dimensional plot showing the range in body terminal voltage afforded by the biasing circuit illustrated in FIG. 4.

FIG. 5 illustrates the range of permissible body voltage for the biased FET circuit 58. The voltage differential between the S/D$_2$ terminal 44 and the S/D$_1$ terminal 40 (i.e., $V_{SD2}-V_{SD1}$) is plotted on the horizontal axis, and the permissible body voltage (i.e., $V_{BODY}-V_{SD1}$) is plotted on the vertical axis. (The graph in FIG. 5 assumes, therefore, that $V_{SD1}$ is the reference voltage for this graph and is equal to zero.) Where the S/D$_2$ voltage exceeds the S/D$_1$ voltage by at least a threshold (e.g., segment 100, where $V_{SD2}-V_{SD1}>V_T$), the body voltage is driven to the S/D$_1$ voltage ($V_{BODY}=V_{SD1}$). Conversely, where the S/D$_1$ voltage exceeds the S/D$_2$ voltage by at least a threshold (e.g., segment 102, where $V_{SD2}-V_{SD1}<-V_T$), the body voltage is driven to the S/D$_2$ voltage ($V_{BODY}=V_{SD2}$). For body voltages within region 104, the body terminal is floating. As an example, consider point 106 on the horizontal axis, where $V_{SD2}-V_{SD1}=+V_T$. The floating body voltage range (i.e., the range over which the body remains floating) extends from $V_{SD1}$ to a diode drop ($\Phi^D$) above $V_{SD1}$. At point 108 where $V_{SD2}=V_{SD1}$ (i.e., $V_{SD2}-V_{SD1}=0$), the floating body voltage range extends from $-V_T$ to $+\phi_D$. Lastly, at point 110 where $V_{SD2}-V_{SD1}=-V_T$, the floating body voltage range extends from $-V_T$ to $\phi_D-V_T$. (The graph moreover assumes that $\phi_D>V_T$, which, of course, need not necessarily be the case.) Stated in other terms, the body voltage floats no higher than a diode drop above the lesser of the S/D$_1$ voltage and the S/D$_2$ voltage (unless the voltage of the "true" substrate is even lower, as described above), and floats no lower than a threshold voltage below the higher of the S/D$_1$ voltage and the S/D$_2$ voltage.

The biased FET circuit 58 has several advantages. Most notably, the body voltage is maintained at or within a fairly narrow voltage range which reduces the body effect of FET 50. This reduces the on-resistance of the FET 50 no matter which direction the FET 50 is conducting (i.e., no matter which source/drain terminal resides at a lower voltage when the FET 50 is conducting). The sizes of FET 54 and FET 56 are non-critical. Moreover, all three FETs of biased FET circuit 58 (for the embodiment depicted in FIG. 4) may be implemented as N-channel FETs and may be implemented within a single P-well region. This affords a compact and efficient layout within an integrated circuit. Furthermore, no additional circuit nodes are created by the biased FET circuit 58, which helps increase circuit density and reduces wiring channel requirements.

Figure 6:
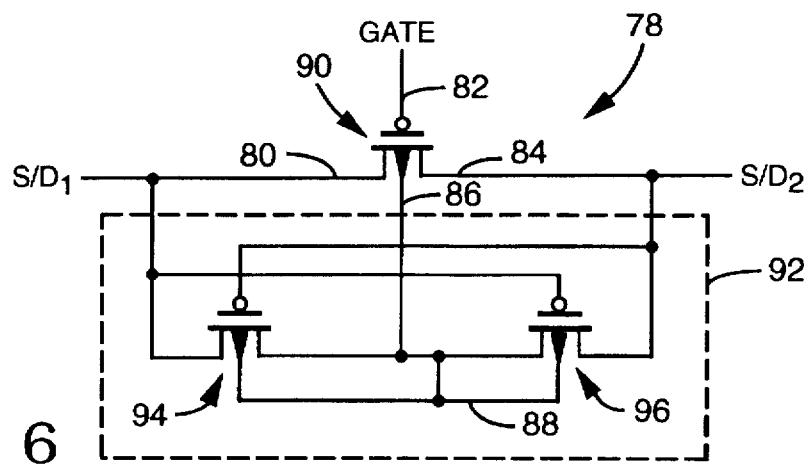
FIG. 6 is a schematic circuit diagram of a second embodiment of a FET and a biasing circuit in accordance with the present invention.

FIG. 6 illustrates an embodiment of the present invention utilizing P-channel transistors. A biased FET circuit 78 includes a P-channel FET 90 having a first source/drain terminal 80 ("S/D$_1$ terminal 80"), a gate terminal 82, a second source/drain terminal 84 ("S/D$_2$ terminal 84"), and a body terminal 86 connected to a body node 88. A biasing circuit 92 includes a P-channel FET 94 having a first source/drain terminal connected to the S/D$_1$ terminal 80, a gate terminal connected to the S/D$_2$ terminal 84, a second source/drain terminal connected to the body node 88, and a body terminal also connected to the body node 88. The biasing circuit 92 also includes a P-channel FET 96 having a first source/drain terminal connected to the S/D$_2$ terminal 84, a gate terminal connected to the S/D$_1$ terminal 80, a second source/drain terminal connected to the body node 88, and a body terminal also connected to the body node 88.

The operation of the biased FET circuit 78 is analogous to the operation discussed above, and may be most easily understood by first assuming that the voltage of the S/D$_2$ terminal 84 exceeds the voltage of the S/D$_1$ terminal 80 by several volts. If the threshold voltage of FET 96 is, for example, +0.6 volts, then the negative gate-to-source voltage of FET 96 (i.e., $-(V_{SD1}-V_{SD2})$) exceeds the threshold voltage of FET 96. Consequently, FET 96 is conductive (and FET 94 is turned off) and the body terminal of FET 90 (body node 88) is electrically coupled to the S/D$_2$ terminal 84. This drives the body voltage of FET 50 to the voltage of S/D$_2$ terminal 84 which, for this example, is the higher in voltage of the two source/drain terminals of FET 90.

On the other hand, assume the voltage of the S/D$_1$ terminal 80 exceeds the voltage of the S/D$_2$ terminal 84 by several volts. If the threshold voltage of FET 94 is, for example, also +0.6 volts, then FET 94 is conductive and the body terminal of FET 90 (body node 48) is electrically coupled to the S/D$_1$ terminal 80. This drives the body voltage of FET 90 to the voltage of S/D$_1$ terminal 80 which, for this assumption, is the higher in voltage of the two source/drain terminals of FET 90.

If neither of the respective voltages of the S/D$_1$ terminal 80 and the S/D$_2$ terminal 84 exceed the other voltage by at least a threshold voltage, then both FET 94 and FET 96 are turned off (neither is conductive) and the body terminal floats within a voltage range. If the body voltage is below this floating range, the body voltage is clamped and pulled-up by the parasitic diode between the P+source/drain regions of each FET (for this example) and the N-well region within which the FETs are implemented, to a voltage equal to a diode drop below the higher of the S/D$_1$ terminal 80 voltage and the S/D$_2$ terminal 84 voltage. Alternatively, if the body voltage is above the floating range, the body voltage is clamped and pulled-down to a voltage equal to the magnitude of the P-channel threshold voltage above the lower of the S/D$_1$ terminal 80 voltage and the S/D$_2$ terminal 84 voltage.

While the invention has been described with reference to various embodiments, it will be understood that these embodiments are illustrative and that the scope of the invention is not limited to them. Many variations, modifications, additions and improvements of the embodiments described are possible. For example, a FET which is an asymmetrical semiconductor structure may nonetheless be operated in a bi-directional fashion and may utilize the teachings and advantages of this invention. Moreover, other devices, such as JFETs and MESFETs which may be affected by the voltage of underlying layers or structures, may also benefit from the invention. Many alternative embodiments will be evident to one skilled in the art using the teachings of this invention disclosure. Consequently, the scope of the invention is not necessarily limited to the embodiments disclosed herein, but rather is defined by the appended claims.

What is claimed is:

1. A method of biasing a bi-directional field effect transistor (FET), said FET having a first source/drain terminal, a second source/drain terminal, and a body terminal, said method comprising:

comparing a first source/drain voltage at the first source/drain terminal with a second source/drain voltage at the second source/drain terminal; and applying a body voltage to the body terminal in response to said comparing step;

wherein the applied body voltage is equal to the greater of the first and second source/drain voltages.

2. A method as in claim 1 wherein said FET comprises a P-channel FET.

3. A method as in claim 1 wherein the applying step comprises applying a body voltage to the body terminal whenever the first and second source/drain voltages differ by more than a particular amount.

4. A method as in claim 3 wherein the particular amount comprises an amount substantially equal to a FET threshold voltage.

5. A method as in claim 1 wherein both the first source/drain terminal and the second source/drain terminal are non-power supply terminals.

6. A method as in claim 1 wherein the FET forms a transmission gate.

7. A method of biasing a bi-directional FET, said FET having a first source/drain terminal, a second source/drain terminal, and a body terminal, said method comprising:

electrically coupling the body terminal to one of said first and second source/drain terminals in response to a first source/drain voltage at the first source/drain terminal and a second source/drain voltage at the second source/drain terminal;

wherein the FET is a P-channel FET; and wherein the coupling step electrically couples the body terminal to one of the first and second source/drain terminals having a greater voltage.

8. A method as in claim 7 wherein the coupling step is performed whenever the first and second source/drain voltages differ by more than a particular amount.

9. A method as in claim 8 wherein the particular amount comprises an amount substantially equal to a FET threshold voltage.

10. A circuit with a biased FET comprising:

a first bi-directional FET having a first source/drain terminal, a second source/drain terminal, and a body terminal; and a biasing circuit for biasing the body terminal of the first FET in response to a first source/drain voltage at the first source/drain terminal and a second source/drain voltage at the second source/drain terminal wherein the biasing circuit electrically couples the body terminal to one of the first and second source/drain terminals having a greater voltage when the first and second source/drain voltages differ by more than a particular amount; and wherein the first FET is a P-channel FET.

11. A circuit as in claim 10 wherein:

the biasing circuit includes no circuit nodes other than those to which the first source/drain terminal of the first FET, the second source/drain terminal of the first FET, and the body terminal of the first FET are connected.

12. A circuit as in claim 10 wherein the particular amount is substantially equal to an FET threshold voltage.

13. A circuit with a biased FET comprising:

a first bi-directional FET having a first source/drain terminal a second source/drain terminal and a body terminal; and a biasing circuit for biasing the body terminal of the first FET in response to a first source/drain voltage at the first source/drain terminal and a second source/drain voltage at the second source/drain terminal wherein the biasing circuit comprises;

a second FET having a first source/drain terminal coupled to the body terminal of the first FET, having a gate terminal coupled to the first source/drain terminal of the first FET, having a second source/drain terminal coupled to the second source/drain terminal of the first FET, and having a body terminal; and a third FET having a first source/drain terminal coupled to the body terminal of the first FET, having a gate terminal coupled to the second source/drain terminal of the first FET, having a second source/drain terminal coupled to the first source/drain terminal of the first FET, and having a body terminal;

wherein the respective body terminals of the first, second and third FETs are interconnected to form a single circuit node; and wherein the first, second, and third FETs are disposed within a common region of a first conductivity type and share a single body terminal.

14. A circuit as in claim 13 wherein each of the first, second, and third FETs is an N-channel FET.

15. A circuit as in claim 13 wherein each of the first, second, and third FETs is a P-channel FET.

16. A circuit as in claim 13 wherein the common region of a first conductivity type comprises a well region.

17. A circuit with a biased FET comprising:

a first bi-directional FET having a first source/drain terminal, a second source/drain terminal, and a body terminal;

first means for coupling the body terminal of the first FET to the first source/drain terminal of the first FET; and second means for coupling the body terminal of the first FET to the second source/drain terminal of the first FET;

wherein the first FET, the first means, and the second means are disposed within a common region of a first conductivity type and share a single body terminal.

18. A circuit as in claim 17 wherein:

the first means comprises a second FET; and the second means comprises a third FET.

19. A circuit as in claim 17 wherein the common region of a first conductivity type comprises a well region.

* * * * *